(12) United States Patent
Tsubakimoto et al.

(10) Patent No.: US 9,203,404 B2
(45) Date of Patent: Dec. 1, 2015

(54) IMAGE READING APPARATUS AND OPERATION DEVICE

(71) Applicant: CANON KABUSHIKI KAISHA, Tokyo (JP)

(72) Inventors: Yasuhito Tsubakimoto, Tokyo (JP); Hiroshi Ogushi, Shiroi (JP); Noboru Shimoyama, Yokohama (JP); Yasushi Ishida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 14/095,323

(22) Filed: Dec. 3, 2013

(65) Prior Publication Data

US 2014/0092624 A1 Apr. 3, 2014

Related U.S. Application Data

(63) Continuation of application No. 13/074,228, filed on Mar. 29, 2011, now Pat. No. 8,625,169.

(30) Foreign Application Priority Data

Mar. 31, 2010 (JP) .................. 2010-082824

(51) Int. Cl.
| | |
|---|---|
| G06F 3/041 | (2006.01) |
| G06F 3/038 | (2013.01) |
| H03K 17/96 | (2006.01) |
| H04N 1/00 | (2006.01) |
| H04N 1/193 | (2006.01) |

(52) U.S. Cl.
CPC .......... *H03K 17/962* (2013.01); *H04N 1/00204* (2013.01); *H04N 1/00397* (2013.01); *H04N 1/193* (2013.01)

(58) Field of Classification Search
CPC ................ H03K 17/962; H01H 2239/006
USPC ..................... 362/23, 602; 200/600
See application file for complete search history.

(56) References Cited

U.S. PATENT DOCUMENTS

| 7,238,901 B2 | 7/2007 | Kim et al. | |
|---|---|---|---|
| 2009/0033636 A1 | 2/2009 | Toyota et al. | |
| 2009/0114518 A1* | 5/2009 | Lin et al. | 200/600 |
| 2010/0214245 A1* | 8/2010 | Hirota | 345/173 |
| 2011/0012845 A1 | 1/2011 | Rothkopf et al. | |
| 2011/0141052 A1 | 6/2011 | Bernstein et al. | |
| 2011/0157064 A1 | 6/2011 | Imai | |
| 2011/0221707 A1* | 9/2011 | Oyobe et al. | 345/175 |
| 2011/0242613 A1 | 10/2011 | Ishida et al. | |
| 2011/0310072 A1* | 12/2011 | Oyobe et al. | 345/207 |
| 2012/0133169 A1 | 5/2012 | George et al. | |

FOREIGN PATENT DOCUMENTS

| JP | 2006-350882 A | 12/2006 |
|---|---|---|
| JP | 2009-88759 A | 4/2009 |
| JP | 2009-243771 A | 10/2009 |

\* cited by examiner

*Primary Examiner* — Jerome Grant, II
(74) *Attorney, Agent, or Firm* — Canon USA Inc. IP Division

(57) ABSTRACT

An operation device includes a cover and a substrate on which a plurality of electrodes which detects a capacitance and which is provided corresponding to each of a plurality of touch switches is mounted. The operation device includes a laminated structure in which at least an elastic sheet that is self-tacking and closely contacts a plurality of electrodes is inserted between the cover and the substrate. At least one through hole is formed at a location on the substrate facing the elastic sheet.

10 Claims, 10 Drawing Sheets

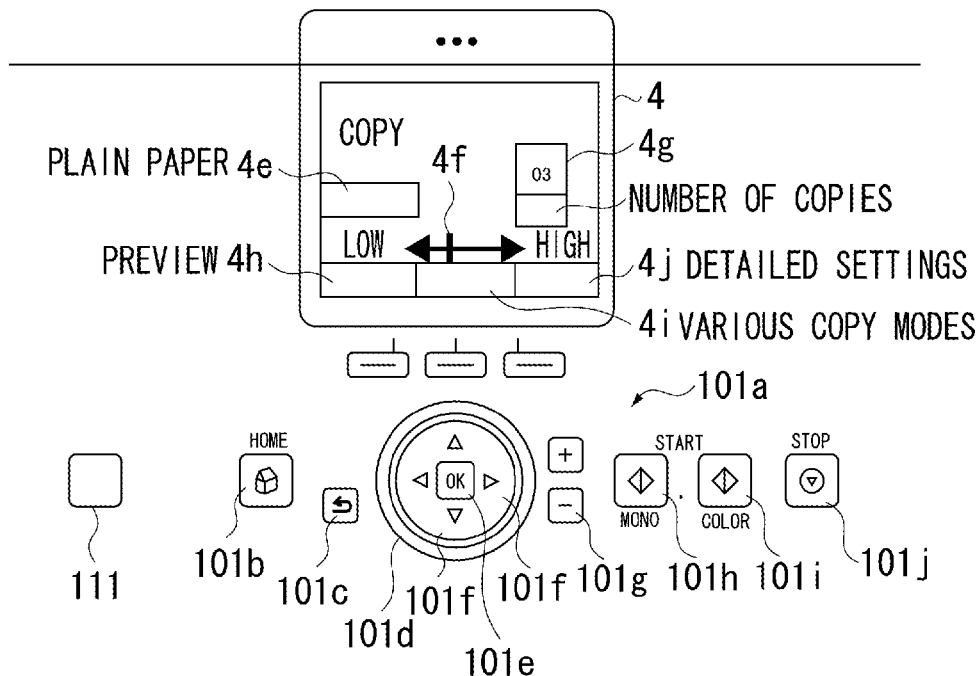

IMAGE READING APPARATUS AND OPERATION DEVICE

CROSS REFERENCE TO RELATED APPLICATIONS

The present application is a Continuation of U.S. patent application Ser. No. 13/074,228 filed Mar. 29, 2011, which claims the benefit of priority from Japanese Patent Application No. 2010-082824 filed Mar. 31, 2010, the entire contents of each of which are hereby incorporated by reference.

BACKGROUND OF THE INVENTION

1. Field of the Invention

The present invention generally relates to imaging and, more particularly, to an apparatus including an image reading unit, such as a scanner, a printer, a facsimile machine, a copying machine, and a multifunction peripheral (MFP).

2. Description of the Related Art

Japanese Patent Application Laid-Open No. 2009-88759 discusses an MFP which includes an image reading unit. The device includes a reading unit, which is configured to read an image of a document set on a reading surface, and a pressing plate, which can open on the reading surface. On an upper surface of the pressing plate, an operation unit, which includes a plurality of input keys, and a display device, such as a liquid crystal display (LCD) panel, are provided.

U.S. Patent Application Publication No. 2009/0033636 A1 discusses a capacitive touch panel input device. The capacitive touch panel input device includes a substrate and a spacer. A plurality of sensor electrodes is implemented on the capacitive touch panel input device. The spacer is set on each sensor electrode.

The spacer includes a first block provided on the electrode and a second block provided within the first block. The conductivity of the second block is lower than that of the first block. Accordingly, the above-described conventional method prevents an error input by hardly receiving the affect from adjacent sensor electrodes.

Another conventional method discussed in the Japanese Patent Application Laid-Open No. 2009-88759 includes an operation unit that has a structure of a mechanical-contact key, such as a tactile switch. However, in terms of lower costs and appropriate component arrangement and design, the operation unit can be replaced with the capacitive input device, such as the one discussed in the U.S. Patent Application Publication No. 2009/0033636 A1.

In the apparatus discussed in the U.S. Patent Application Publication No. 2009/0033636 A1, it is required to divide the spacer into a multiple of minute blocks and to arrange them at precise locations. Accordingly, the configuration of a switch may become too complicated to easily manufacture the stitch. Furthermore, it may become difficult to reduce the costs of manufacture thereof.

In addition, in the apparatus discussed in the U.S. Patent Application Publication No. 2009/0033636 A1, if air enters the space between the sensor electrode on the substrate and the spacer during assembly and if a partial air gap arises, the capacitance may not be detected at a high accuracy. Accordingly, extreme care is necessary when assembling the apparatus discussed in the U.S. Patent Application Publication No. 2009/0033636 A1.

SUMMARY OF THE INVENTION

The present invention is directed to a low-cost image reading apparatus including a capacitive operation panel having a simple switch configuration and which can be easily manufactured.

According to an aspect of the present invention, an apparatus includes a reading unit configured to read an image of a document set on a reading surface, a pressing plate capable of opening relative to the reading surface, and an operation device provided on an upper surface of the pressing plate, wherein the operation device includes a cover, a plurality of touch switches provided at different locations of the cover, each touch switch including an electrode configured to detect a capacitance, a substrate on which a plurality of the electrodes is mounted, and a self-tacking elastic sheet provided between the cover and the substrate, wherein the elastic sheet is not divided and is common to the plurality of electrodes.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the present invention.

FIGS. 5A through 5C illustrate a state of keys displayed in each of a plurality of modes.

DESCRIPTION OF THE EMBODIMENTS

Various exemplary embodiments, features, and aspects of the invention will be described in detail below with reference to the drawings.

A first exemplary embodiment of the present invention will now be described below. In the following description, apparatuses which have an image reading unit configured to read an image of a document, such as a scanner, a printer, a facsimile apparatus, a copying machine, or a multifunction peripheral (MFP), will be collectively referred to as an "image reading apparatus".

Figure 1A:
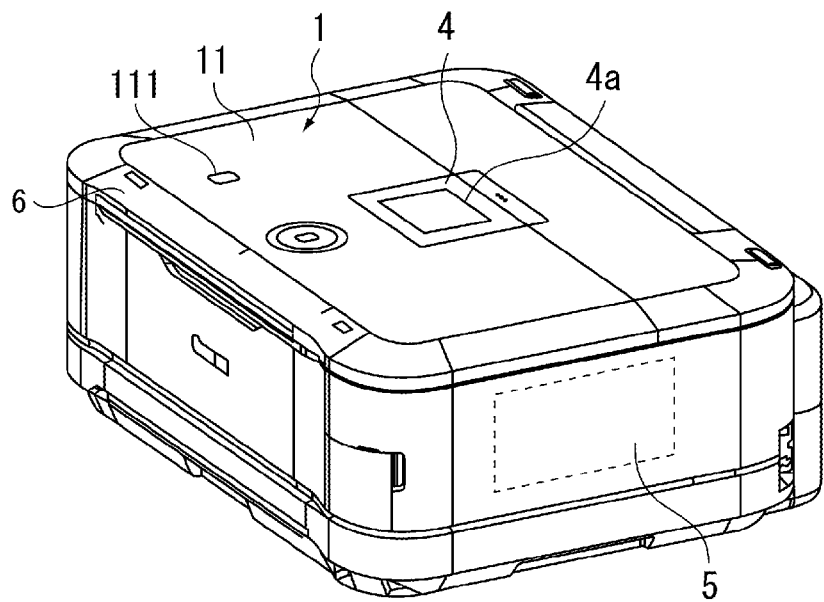
FIGS. 1A and 1B are perspective views illustrating an exemplary configuration of an apparatus according to an exemplary embodiment of the present invention.
Figure 1B:
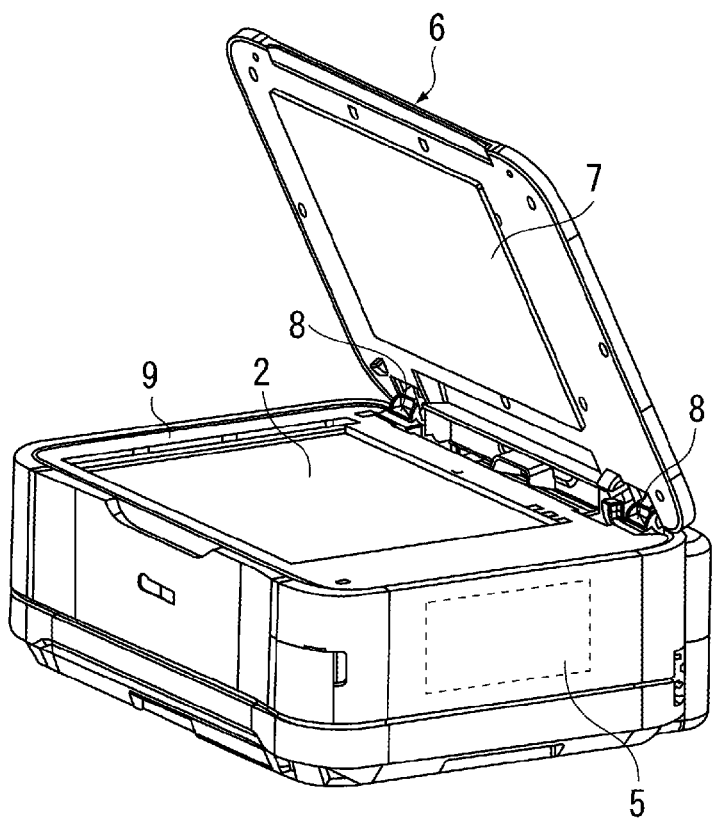

FIGS. 1A and 1B illustrate an exemplary configuration of an image reading apparatus according to the present exemplary embodiment. FIG. 1A illustrates a state of the image reading apparatus in which a pressing plate thereof is closed while in FIG. 1B, the pressing plate is opened.

The image reading apparatus, within a housing thereof, includes a reading unit having a flatbed scanner, a recording unit, and a control unit 5. The reading unit reads an image of a document set on a reading surface. The recording unit prints a document image read by reading the document on a sheet. The control unit 5 controls an operation of the entire image reading apparatus. The reading unit and the recording unit are implemented by a well-known art, such as the conventional device discussed in the Japanese Patent Application Laid-Open No. 2009-88759. Accordingly, the reading unit and the recording unit will not be described in detail in the present specification.

The control unit 5 is constituted by a controller board, which includes a central processing unit (CPU), a memory, and various input/output (I/O) interfaces. A pressing plate 6 is provided at the top portion of the image reading apparatus and can open on a reading surface 2.

After appropriately installing the image reading apparatus to a user (operator)'s environment, the operator can access the image reading apparatus from the left (the front side) of FIGS. 1A and 1B.

Referring to FIG. 1A, the pressing plate 6 is a document positioning plate cover, which presses the document when closed. A panel unit 1 is provided on the upper surface of the pressing plate 6.

The panel unit 1 includes a panel cover 11. On the panel cover 11, a display unit 4 and various operation keys (input switches) are installed closely to one another. In addition, a power button 111 is installed to the panel cover 11. The operation keys are capacitance touch switches except the power button 111.

The capacitance touch switch is a touch switch that detects the capacitance, which varies when the operator touches its touch-operation surface with his/her finger, and recognizes the detected capacitance as an input. The detailed configuration of and an operation executed by the capacitance touch switch will be described in detail below.

The display unit 4 includes a display window 4a, which is constituted by a transparent member. When the display unit 4 is retracted, the display unit 4 is tilted just onto the surface of the panel cover 11, as illustrated in FIG. 1A. The display unit 4 can be pivoted by the operator to be tilted up to become oriented towards the front of the image reading apparatus. In other words, when the display unit 4 is retracted (pivoted down), a display of the display window 4a can be viewed from above. On the other hand, when the display unit 4 is extended (pivoted up), the display of the display window 4a can be viewed from the front.

The power button 111 has a structure of a mechanical contact key, such as a tactile switch. If the operator presses the power button 111 when the image reading apparatus has been powered off, the apparatus is powered on. On the other hand, if the operator presses the power button 111 when the image reading apparatus has been powered on, the apparatus is powered off.

Referring to FIG. 1B, the pressing plate 6 is pivotably mounted to a frame 9 in a back portion (the opposite portion of the front portion thereof) at two locations by using hinges 8. The reading surface 2 is constituted by a transparent glass plate. The operator sets a document on the upper surface of the reading surface 2 in a face-down state (i.e., with the surface of the document to be read facing downwards). The perimeter of the glass plate is covered with a cover to be mounted to the frame 9.

A press-contact sheet 7 is mounted to the inner (back) surface of the pressing plate 6 in order to prevent floating of the document set on the reading surface 2 by applying pressure onto the document. Vertical play is provided to engagement between the hinge 8 and the pressing plate 6. Accordingly, the image reading apparatus can read an image of a thick book document.

The control unit 5 controls various operations executed by the image reading apparatus. More specifically, the control unit 5 controls an operation of each of the reading unit and the recording unit. In addition, the control unit 5 controls the display by the display unit 4, a switch input that is input by an operation on the touch switch, and the display of the touch switch.

As will be described below, the control unit 5 controls a plurality of operation modes of the image reading apparatus. More specifically, the control unit 5 toggles on and off a backlight of the touch switch (i.e., light for illuminating the touch switch from behind) according to each selected operation mode.

Figure 2A:
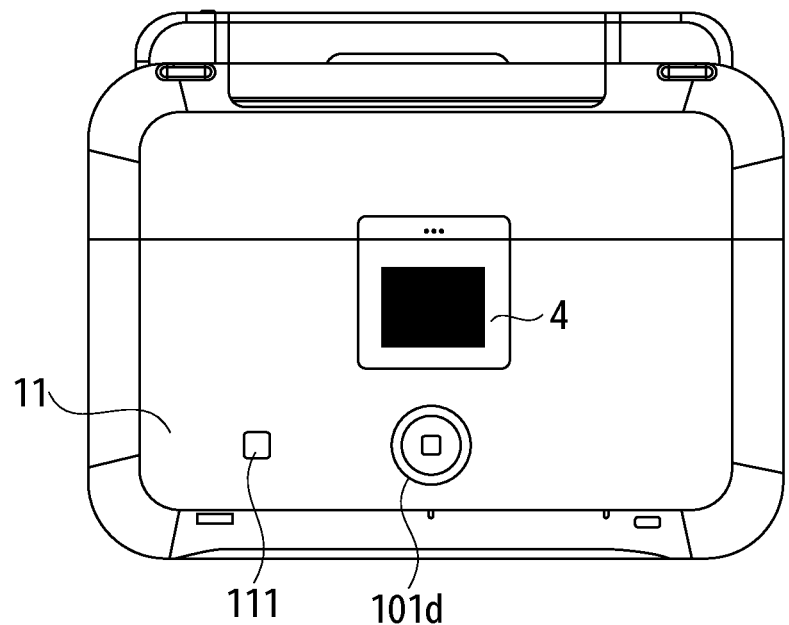
FIGS. 2A and 2B illustrate a state of display on an operation panel in each of power-off and power-on states.
Figure 2B:
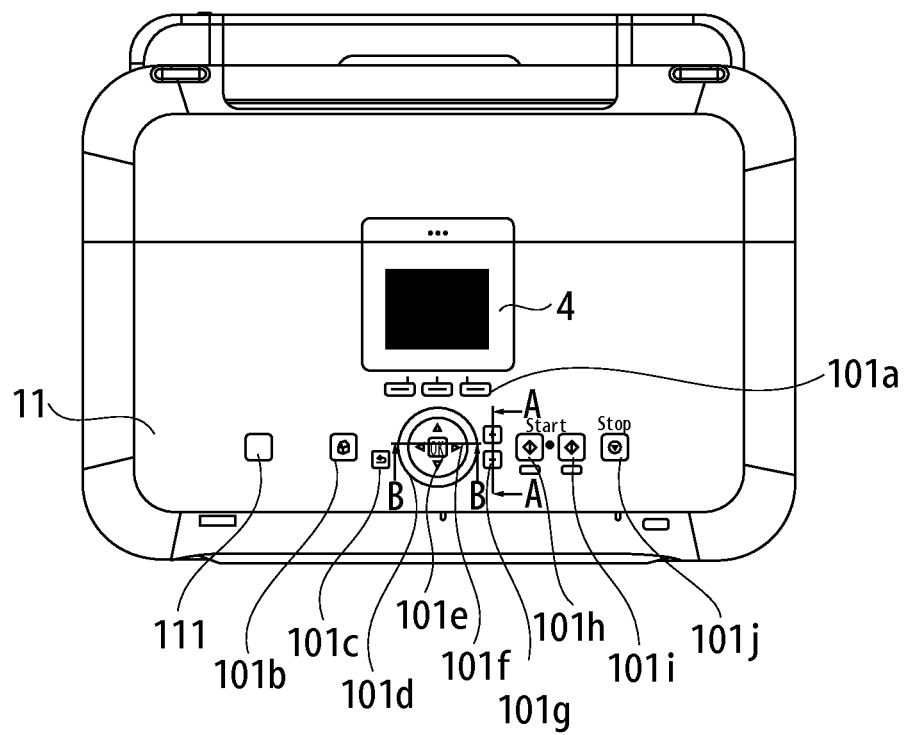

FIGS. 2A and 2B are top views of the image reading apparatus, which illustrate a status of display on an operation panel (operation device) provided to the panel cover 11 on the upper surface of the pressing plate 6.

In the example illustrated in FIG. 2A, the image reading apparatus has been powered off. Various operation keys of an operation unit of the image reading apparatus are out of view of the operator except the power button 111 and a jog wheel 101d.

In the example illustrated in FIG. 2B, the image reading apparatus has been powered on and all the operation keys are displayed in a lit state. When the key is displayed in a lit state, the operator can validly input information via the operation key displayed in the lit state.

In the example illustrated in FIG. 2B, the operation key includes a home key 101b, a return key 101c, which can be operated to a previous state, a monochromatic copy key 101h, a color copy key 101i, and a stop key 101j. The monochromatic copy key 101h is a key for instructing the start of a monochromatic copy operation or a monochromatic image scan operation. The color copy key 101i is a key for instructing the start of a color copy operation or a color image scan operation. The stop key 101j is a key for instructing the discontinuation of the current copy operation or scan operation.

In addition, the operation key includes a function key 101a. The function key 101a is constituted by three keys, which can be operated for selecting a display item displayed on a screen of the display unit 4. Furthermore, the operation key includes four-arrow (four-direction) key 101f and a jog wheel 101d. The four-direction key 101f can be operated to move a cursor up, down, left, or right on the screen displayed on the display unit 4. The jog wheel 101d has a wheel-like shape and can be operated to move the cursor.

The operation key includes an OK key 101e and plus-minus ("+" and "−") keys 101g. The OK key 101e can be operated to finally inputting an operator selection. The plus-minus keys 101g can be operated to set numerical values, such as the number of copies.

Each of the above-described operation keys is a capacitance touch switch, which includes a backlight. The backlight of each operation key can be independently turned on or off. When the backlight is turned on, a graphic (mark), which is uniquely assigned to the corresponding key, is displayed. Accordingly, the operator can easily recognize the operation key. On the other hand, when the backlight of the operation key is turned off, the mark on the key become hardly recognizable for the operator. Note that the meaning of "turned off" contains not only the backlight becoming off completely, but also becoming alight with a weak power.

Figure 3A:
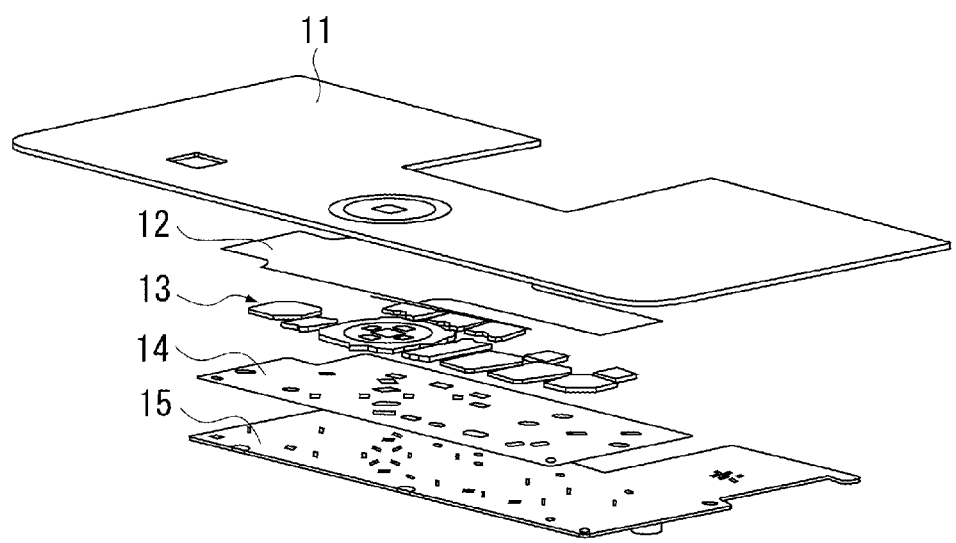
FIGS. 3A and 3B illustrate an exemplary structure of a panel unit.
Figure 3B:
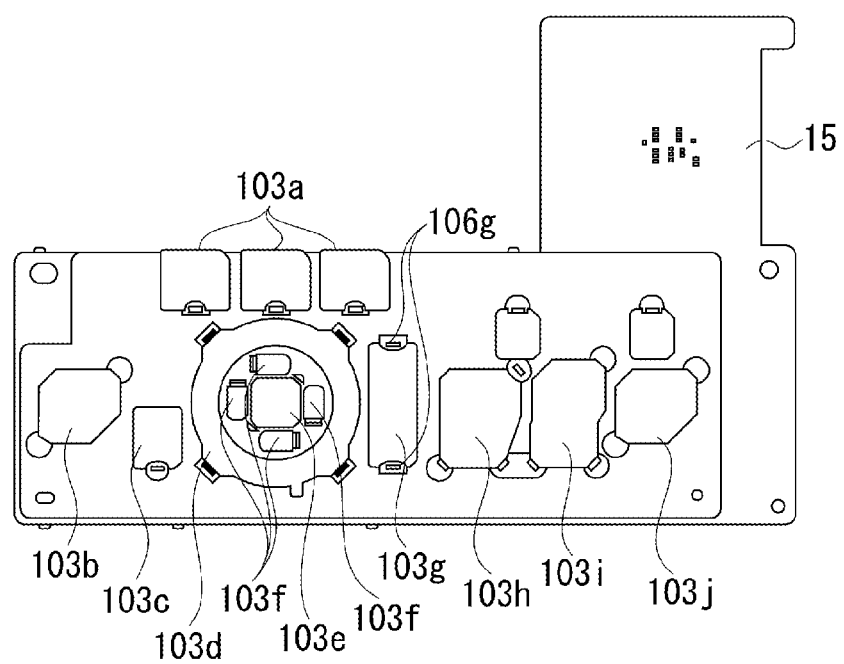

FIGS. 3A and 3B illustrate an exemplary configuration of the panel unit 1. More specifically, FIG. 3A is an exploded perspective view of a laminated structure of the panel unit 1. FIG. 3B is a top view of the panel unit 1.

Referring to FIG. 3A, the panel unit 1 includes a five-layer laminated structure including, in order from the front (upper) surface to the back (bottom) surface, the panel cover 11, an elastic sheet 12, a light guide element group 13, an elastic sheet 14, and a circuit substrate 15. The panel unit 1, as a whole, is an integrated structural member, which is closely laminated together by using the elastic sheet 12 and the elastic sheet 14.

More specifically, the elastic sheet 12 (a first elastic sheet), which is a translucent sheet, is laminated between the panel cover 11 and the light guide element group 13 to closely attach the panel cover 11 and the light guide element group 13 together.

Similarly, the elastic sheet 14 (a second elastic sheet), which has a sheet-like shape, is inserted between the light guide element group 13 and the circuit substrate 15 to closely attach the light guide element group 13 and the circuit substrate 15 together. It is not necessary that the elastic sheet 14 is translucent. Both the elastic sheets 12 and 14 are made of a nonconductive insulating material.

The panel cover 11 is an integrated seamless board-like transmissive (transparent or translucent) member. The panel cover 11 is made of a plastic material, such as acryl, acrylonitrile butadiene styrene (ABS), polycarbonate (PC), methyl methacrylate-butadiene-styrene resin (MBS), or styrenic-block-copolymers (SBC), or a glass material.

Each of the elastic sheets 12 and 14 is one integrated (non-divided) sheet, which is commonly provided for a plurality of electrodes. Because each of the elastic sheets 12 and 14 is an integrated (non-divided) sheet, it becomes easy to assemble the operation panel.

In assembling the operation panel, the panel cover 11 and the light guide element group 13 should be completely and closely attached together by laminating the elastic sheet 12 between them without any gap or space. This is because if the panel cover 11 and the light guide element group 13 are not completely closely attached together and if an air gap of low conductivity may arise due to the loose attachment between them, variation of the capacitance may not be stably detected. As a result, the reliability of the capacitance touch switch may degrade.

Furthermore, in order to easily exchange the panel cover 11 in a maintenance operation, the elastic sheet 12 should be easily removable, even after it may once have been closely laminated, without any residual bond. In order to achieve the sufficiently close attachment properties and the highly easy removability of the elastic sheet 12 at the same time, the present exemplary embodiment uses a self-tack elastic sheet for the elastic sheet 12, which can be adhered without using a bond. For the elastic sheet described above, a gel sheet can be used.

The elastic sheet 14, which is used for closely attaching the light guide element group 13 and the circuit substrate 15 (on the surfaces of the plurality of electrodes) together, should have the same characteristic as that of the elastic sheet 12. Accordingly, for the elastic sheet 14, the self-tacking elastic sheet, such as a gel sheet, can be used.

It is not necessary that both the elastic sheets 12 and 14 should always be gel sheets. In other words, either one of the elastic sheets 12 and 14 only can be a gel sheet. In addition, a sheet which is different from a gel sheet and made of a material having the same self-tacking properties and elasticity can be used as the elastic sheets 12 and 14. Furthermore, a two-sided adhesive tape that cannot be easily damaged when removed, such as a two-sided adhesive tape made by using polyethylene terephthalate (PTE), can be used.

FIG. 3B illustrates an exemplary arrangement of light guide elements, which are included in the light guide element group 13 and arranged on the circuit substrate 15. Referring to FIG. 3B, the light guide element group 13 includes light guide elements 103*a* through 103*j*, which are arranged at locations corresponding to touching locations of the capacitance touch switch.

Figure 4A:
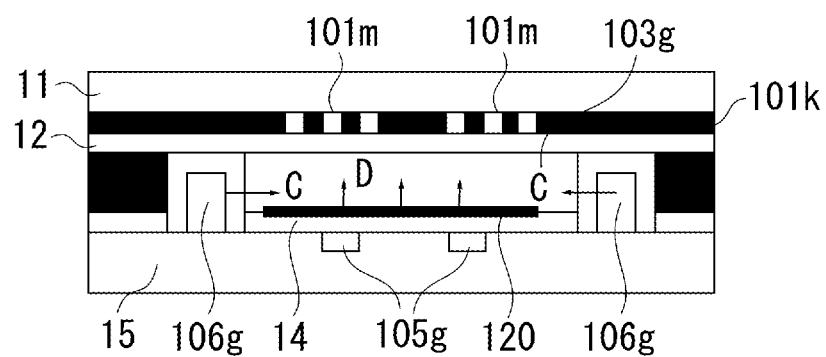
FIGS. 4A and 4B are cross sections of a capacitance touch switch.
Figure 4B:
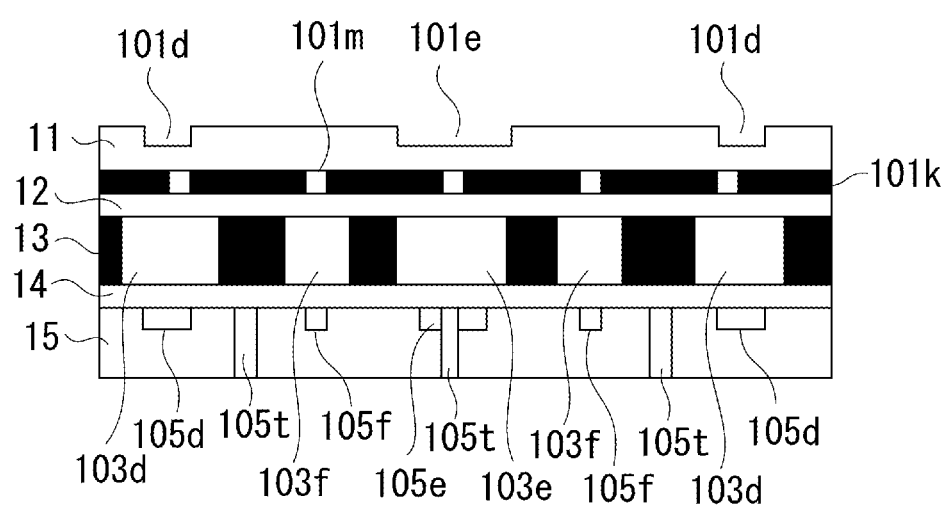

FIGS. 4A and 4B are cross sections of a capacitance touch switch. FIG. 4A is an A-A cross section of the plus-minus ("+" and "−") keys 101*g* illustrated in FIG. 2B.

On the surface of the panel cover 11 on its back side, a light-shielding layer 101*k* is formed by printing that uses a black ink. On the light-shielding layer 101*k*, a transmissive graphic portion 101*m*, which includes a light-transmissive portion that is partially not subjected to printing using the black ink, is formed.

Viewed from above, the transparent graphic portion 101*m* takes a specific graphical shape. In the example illustrated in FIGS. 4A and 4B, the transparent graphic portion 101*m* takes a shape of a graphic constituted by the symbols '+' and '−' surrounded by a rectangle as illustrated in FIG. 2B.

The panel cover 11 is translucent. Accordingly, if the transparent graphic portion 101*m* is illuminated with light by the backlight from behind (from the bottom), the graphical shape of the transparent graphic portion 101*m* can be recognized by the operator. If the backlight is turned off, the graphical shape of the transparent graphic portion 101*m* is not illuminated with light (i.e., turns completely dark to become less recognizable). Therefore, in this state, the operator cannot recognize the graphical shape of the transparent graphic portion 101*m*.

As a result of an experiment conducted by the inventors, by using the panel cover 11 made of a translucent gray/smoke material, it became very difficult for the operator to visually recognize the transparent graphic portion 101*m* when the backlight had been turned off. In this state, the graphical shape of the transparent graphic portion 101*m* was actually visually unrecognizable for the operator. Accordingly, the contrast between the graphical display on-state and the graphical display off-state became more intense.

The panel cover 11 is constituted by one integrated board-like member. Accordingly, if the backlight is turned off, the switches except the power button 111, the jog wheel 101*d*, and the OK key 101*e* become less recognizable. Accordingly, in this state, the operator would not be annoyed at which switch to operate. In addition, in this state, the beauty of the image reading apparatus can be increased.

A light source 106*g*, which is constituted by a semiconductor light source, is mounted onto the circuit substrate 15 at two locations thereof. For the semiconductor light source, a light-emitting diode (LED) or an organic light emitting diode (OLED) can be used.

In the present exemplary embodiment, the light is emitted from the light source 106*g* in a direction horizontal to the surface of the operation panel and in a direction of incidence of light to the light guide element 103*g* via the side of the light guide element 103*g*.

When the light source 106*g* is turned on, a diffused light flux, which goes around a direction of an arrow C, is incident to the light guide element 103*g*. The diffused light flux that has been incident to the light guide element 103*g* is repeatedly reflected within the light guide element 103*g* to be further transmitted.

On the bottom surface of the light guide element 103*g*, a diffusion surface 120 is formed by applying white coating (white paint) thereon. After being incident on the diffusion surface 120, the light is diffusion-reflected and a part thereof is diffused upwards (in a direction indicated by an arrow "D".

The light is shielded by the light-shielding layer 101k but is externally emitted from the transparent graphic portion 101m. Accordingly, the symbols "+" and "−" become visually recognizable by the operator. As described above, the backlight is constituted by the light source and the light guide element.

At a location on the circuit substrate 15 immediately below a touching position, i.e., at a location corresponding to the diffusion surface 120 between two light sources 106g, two electrodes 105g are implemented to independently detect the status of touching on the "+" and "−" keys. In addition, a signal processing circuit (including a processor), which is electrically connected to each electrode, is installed on the circuit substrate 15.

The signal processing circuit converts the variation of the capacitance, which is detected at the electrode, into digital data. Furthermore, the signal processing circuit executes signal processing to determine the status of switching ("on" and "off" states). When the operator touches the panel cover 11, the region of the panel cover 11 touched by the operator by the fingertip and the electrode 105g function as a kind of a capacitor together. Accordingly, when the operator touches the surface of the panel cover 11 with his fingertip, the capacitance varies.

The signal processing circuit determines whether the panel cover 11 has been touched by the operator according to a result of detection of the variation of the capacitance by using the electrode 105g.

If an input via the touch switch has been previously enabled, the signal processing circuit determines that a switch input has been executed (that the switch has been set "on") if the capacitance detected by the electrode has exceeded a predetermined threshold value. On the other hand, if an input via the touch switch has been previously disabled, the signal processing circuit discards the capacitance detected by using the electrode or raises the above-described predetermined threshold value.

FIG. 4B is a B-B cross section of the capacitance touch switch at locations of the arrow key 101f, the jog wheel 101d, and the OK key 101e illustrated in FIG. 2B. On the front surface of the panel cover 11, a recessed dent is formed at a location thereof corresponding to the OK key 101e.

Similarly, for the jog wheel 101d, which has a ring-like shape, a ring-like recessed dent (groove) is formed. No dents or grooves are formed at locations corresponding to the other keys.

By providing a groove to a highly frequently used key, the operator is enabled to always execute correct operations according to a sense of touch and sight provided to the operator.

In particular, with respect to the jog wheel 101d, because the ring-shaped dent physically guides the motion of the operator's finger, the operator is enabled to smoothly slide his finger on the touching surface along correct locations. Accordingly, the operability of the apparatus can become high.

A light guide element 103e is provided below the OK key 101e. Four light guide elements 103f are provided below the four arrow keys 101f, respectively. Below the jog wheel 101d, a ring-like shaped light guide element 103d is provided. Below the respective light guide elements 103e, 103f, and 103d, electrodes 105e, 105f, and 105d are provided on the circuit substrate 15.

A through hole 105t is formed on the circuit substrate 15 at the location of each electrode. Air is released from the through hole 105t when attaching the light guide element group 13 and the circuit substrate 15 together by using the elastic sheet 14 on a large area. Accordingly, an air gap cannot easily arise between the elastic sheet 14 and the surface of the electrode.

As described above, the present exemplary embodiment employs the gel sheet having high close-attachment properties as the elastic sheet 14. In addition, the present exemplary embodiment provides the through-hole 105t to the circuit substrate 15. Due to a synergetic effect of these effects, no air gap can easily arise during assembly of the operation panel.

In the present exemplary embodiment, for the OK key 101e and the jog wheel 101d, the distance between the surface (touching surface) of the panel cover 11 and the corresponding electrode is shorter than the distance between the touching surface of the panel cover 11 and the arrow key 101f by the dimension corresponding to the depth of the recessed dent. The variation of capacitance when touched by the operator may become greater as the above-described distance becomes shorter. Accordingly, the greater the distance is, the detection sensitivity may become higher.

If the operator has touched the touching surface at the boundary between adjacent keys, it is likely that the OK key 101e or the jog wheel 101d, whose detection sensitivity is high, may sense the touching operation by the operator. For the frequency of use as a switch, the OK key 101e and the jog wheel 101d have the greater frequency of use than that of the arrow key 101f. Accordingly, the design in which the key having a higher frequency of use preferentially detects the operator's operation is highly rational and useful.

More specifically, the plurality of touch switches includes mutually adjacent switches (a first switch (the OK key 101e or the jog wheel 101d) and a second switch (the arrow key 101f)) having different detection sensitivity levels. The detection sensitivity of the first switch, which is more frequently used of the two, is higher than that of the second switch.

For the OK key 101e and the jog wheel 101d, the distance to the corresponding electrodes varies according to the location on the dent on the panel cover 11. Due to the variation in the distance to the corresponding electrode, the detection sensitivity of the capacitance switch can be different.

More specifically, for each of the OK key 101e and the jog wheel 101d, the dent implements two functions at the same time, i.e., a function for guiding the operator's finger and a function for adjusting the detection sensitivity. Accordingly, the present exemplary embodiment implements a high operability and reliability with a simple configuration.

Particularly for the jog wheel 101d, the location of the operator's finger may easily deviate from the intended position because the operator moves his finger along the ring-like shape. However, because the ring-shaped dent physically guides the motion of the operator's finger, it is made as unlikely as possible that the operator's finger goes off the intended position on the ring-shaped groove to touch the arrow key 101f.

Even if the operator's finger has gone off the intended position, the jog wheel 101d preferentially senses the touching operation due to the difference in the detection sensitivity. With the combination of the physical guidance of the operator's finger and the preferential order according to the difference in the detection sensitivity, the present exemplary embodiment can implement a very high operability and reliability.

Now, an exemplary state of display of the key in each of the plurality of modes will be described in detail below with reference to FIGS. 5A through 5C.

FIG. 5A illustrates an exemplary state of display on the display unit 4 and the panel cover 11 immediately after the apparatus has been booted up by the operator operating the power button 111. On the display unit 4, three functional icons, including a "scan" icon, a "copy" icon, and a "setting" icon, which can be selected at this timing, are displayed.

The "scan" icon corresponds to a scan mode. The "copy" icon corresponds to a copy mode. On the panel cover 11, three types of keys including the home key 101b, the left-right arrow keys 101f, and the OK key 101e only are displayed.

If the operator touches either one key portion of the left-right arrow key 101f, a cursor 4d displayed on the display unit 4 moves to the left or right to switch the function to select. More specifically, if the operator desires to select the copy mode, the operator moves the cursor 4d to the location below the copy icon and touches the OK key 101e. In this case, the operation mode shifts to the copy mode and the display shifts to the display illustrated in FIG. 5B.

On the display unit 4, various setting menus for the copy mode are displayed. On the panel cover 11, the keys used in the copy mode only are displayed. The operator touches either one key portion of the up-down arrow key 101f to set a paper type 4e. Then, the operator touches either one key portion of the left-right arrow key 101f to set a copy density 4f. Furthermore, the operator touches either one of the "+" key and the "−" key 101g to set a number of copies 4g. To select a value of each of functions "preview" 4h, "various copy modes" 4i, and "detailed settings" 4j, the operator touches either of the tree functions keys 101a, which are provided below each function. If the operator touches the home key 101b or the return key 101c, the copy mode ends and the display returns to the default display screen illustrated in FIG. 5A.

As illustrated in FIG. 5B, the backlight for the keys not used in the copy mode is turned off to make them visually unrecognizable. If the operator touches the visually unrecognizable keys, no input can be executed (any input is invalid) via the unrecognizable key.

Similarly, if the scan mode has been selected, the backlight for the keys not used in the scan mode is turned off to make them visually unrecognizable. No input can be validly executed by operating the visually unrecognizable keys.

In the copy mode or the scan mode, the operator sets the document on the reading surface 2. Accordingly, the operator opens and closes the pressing plate 6 by holding the same at the edges thereof. The present exemplary embodiment having can reduce the threat of causing a malfunction of the apparatus due to erroneous touching on the panel cover 11 with the operator's finger to a minimum.

After the setting is completed, the operator touches either of the monochromatic copy key 101h or the color copy key 101i. Then, either of a monochromatic copy operation (in the scan mode, a monochromatic image scan operation) and a color copy operation (in the scan mode, a color image scan operation) is started. Then, the document set on the reading surface 2 is scanned by using the scanner of the reading unit. In the copy mode, the recording unit then prints the read document image based on the image data acquired by the reading operation.

Figure 5C:
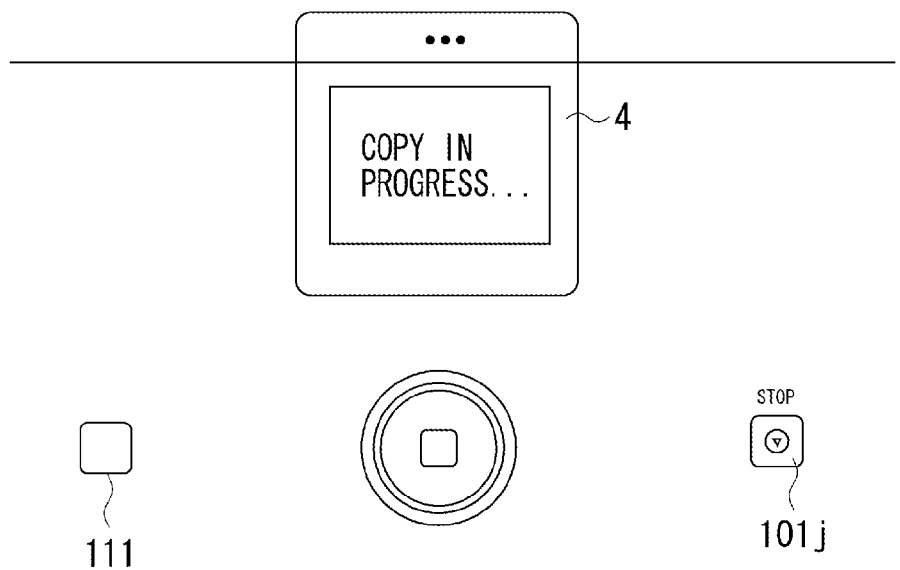

In this case, the state of display on the display unit 4 and the panel cover 11 shifts to the display illustrated in FIG. 5C. Only the stop key 101j and the power button 111, which can be operated to instruct the discontinuation of the current copy or the scan operation, can be operated during the reading operation.

In this state, a message "copy in progress . . . " (in the scan mode, "scan in progress . . . ") is displayed. On the panel cover 11, the keys and buttons become visually unrecognizable except the stop key 101j and the power button 111. If the operator touches the unrecognizable key, the key does not sense the touching.

If a thick book document is set on the reading surface 2, the operator may press the pressing plate 6 on its portion above the operation panel thereof to closely set the surface of the document onto the reading surface 2. If the operator's hand or finger may have touched the switch on the panel cover 11, the switch does not sense the touching if the operator has touched the stop key 101j or the power button 111. Accordingly, an unintended input can be appropriately prevented.

In addition, most backlights have been turned off when the operator presses the document on the pressing plate 6. At this timing, the switches are not visually recognizable to the user. Accordingly, the user may not feel hesitated to press the document on the pressing plate 6 on a portion above the operation panel.

Under control of the control unit 5, if the apparatus is left untouched or unoperated in the state illustrated in FIG. 5A or 5B for a predetermined time, the apparatus automatically shifts to its sleep mode for saving power. In the sleep mode, the backlights for the operation keys on the display unit 4 and the panel cover 11 are turned off to shift to the state illustrated in FIG. 2A.

In the sleep mode, the backlights are turned off. However, all the operation keys can be operated to validly execute an input. Accordingly, if the operator touches the portion corresponding to an arbitrary operation key, the touching operation is sensed and detected. Therefore, in this case, the operation mode shifts from the sleep mode to the normal mode.

As described above, the apparatus of the present exemplary embodiment includes the sleep mode in which the power consumption is smaller than that in the normal mode. In the normal mode, the backlight corresponding to the touch switch via which an input can be validly executed is turned on while the backlight corresponding to the touch switch via which an input cannot be validly executed is turned off. In the sleep mode, all the plurality of backlights is turned off and the touch switch can be operated to validly execute an input.

As described above, the apparatus according to the present exemplary embodiment of the present invention includes the operation panel having the capacitance touch switch, which is provided on the upper surface of the pressing plate. Compared with a general mechanical switch, the switching surface of the switch of the capacitance touch switch can be more firmly constructed.

Of the capacitance touch switch and a pressure-sensitive touch switch, the surface of the capacitance touch switch can be more firmly constructed. Accordingly, if the operator has pressed the switching surface of the switch in pressing the document by placing his hand on the pressing plate, the apparatus according to the present exemplary embodiment of the present invention, which employs the capacitance touch switch as described above, can bear a very high pressure force.

It is particularly useful to employ the capacitance touch switch because it is necessary for the operator to press a book document by the pressing plate with a very high pressing force. Because the upper surface of the pressing plate is an exposed surface, the operator may spill some liquid of a beverage thereon or may bump a foreign material thereon.

The capacitance switch which the present exemplary embodiment employs has a high resistance to a case where if any beverage is spilled or if a local impactive force is applied to the touch switch.

With the above-described configuration, the apparatus according to the present exemplary embodiment includes the backlights, each of which is provided for each of the plurality of touch switches and which can be turned on and off independently from one another. Accordingly, the apparatus toggles each backlight for each of the corresponding touch switches on and off according to the operation mode.

If the backlight corresponding to a key via which an input can be validly executed only is lit, the operator who is not accustomed to operate the apparatus may not be annoyed for deciding which touch switch to operate.

In addition, when the operator presses a document by the pressing plate, if the backlight for the touch switch corresponding to an unused key has been turned off, the operator can positively execute an operation via the operation panel because the switch is appropriately visually unrecognizable in this case.

In addition, in the sleep mode, all the backlights of the touch switch corresponding to all the keys are turned off but an input can be validly executed thereby. More specifically, in the sleep mode, the operator can return the apparatus to the normal mode by merely pressing the operation panel at an arbitrary location thereof.

Furthermore, the operator's finger touching the panel cover is guided by the dent provided on the surface of the panel cover, which dent being provided at the location of the first switch. Accordingly, the difference between the detection sensitivity of the first switch and that of the second switch is secured. With this configuration, the present exemplary embodiment can implement a very high operability and reliability with a simple configuration. It is particularly very useful to provide the ring-shaped dent to the jog wheel (ring switch).

The shape of the jog wheel is not limited to a circular (ring) shape. More specifically, the jog wheel can take a polygonal ring-like shape. Furthermore, the ring-like shape of the jog wheel is not limited to a completely continued closed shape. In other words, the ring-like shape can include one or more breaks.

In a second exemplary embodiment of the present invention, a touch switch having no backlight will be described in detail below. In the present exemplary embodiment, the image reading apparatus has the same entire configuration as that described above with reference to FIGS. 1A and 1B in the first exemplary embodiment.

Figure 6A:
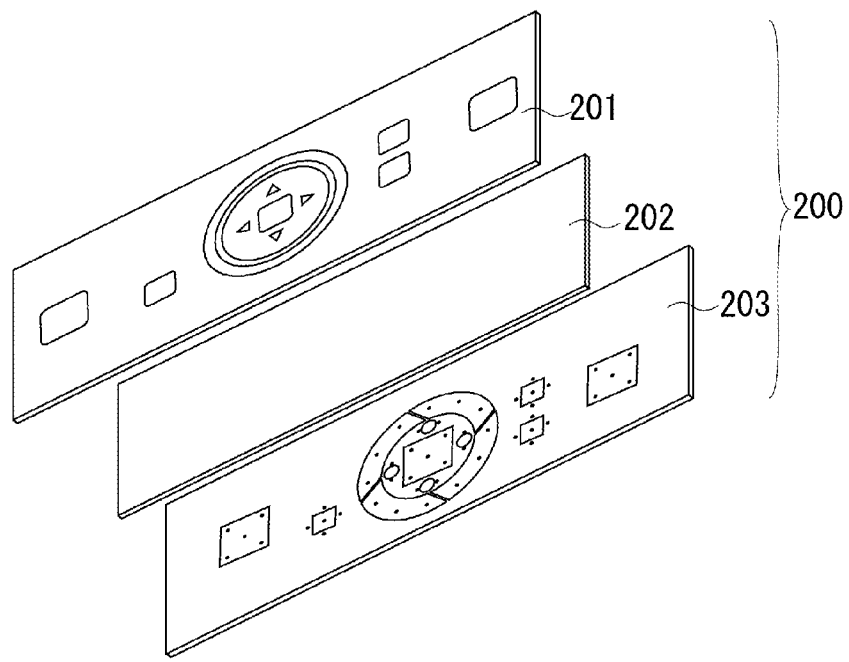
FIGS. 6A and 6B illustrate an exemplary configuration of a touch switch according to a second exemplary embodiment of the present invention.
Figure 6B:
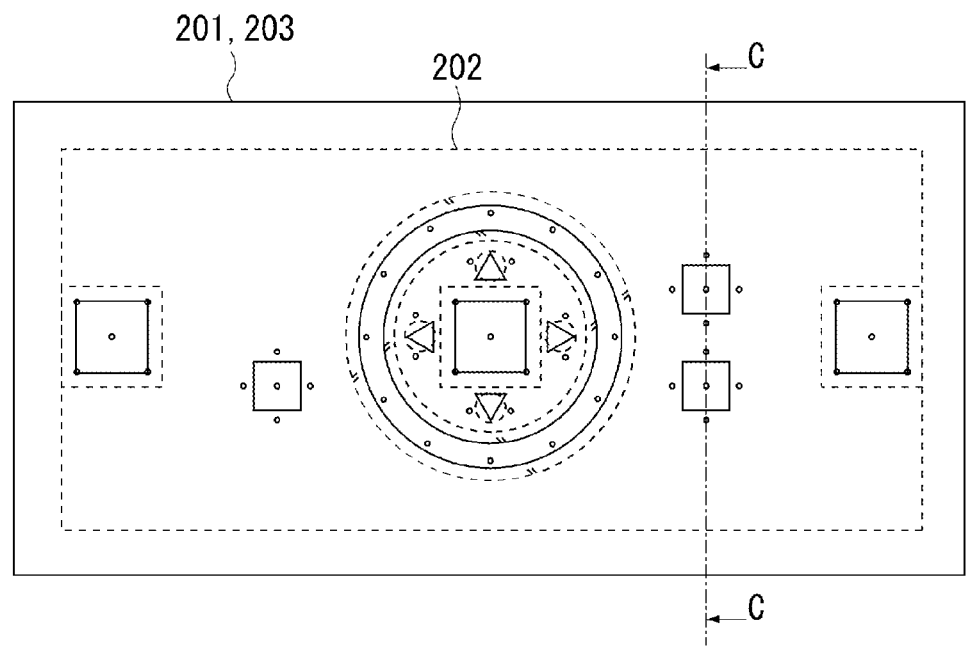

FIG. 6A is an exploded perspective view illustrating an exemplary laminated structure of the touch switch. Referring to FIG. 6A, a touch switch 200 has a laminated structure having three layers, including a panel cover 201, an elastic sheet 202, and a circuit substrate 203. FIG. 6B is a perspective view illustrating the lamination when the panel cover 201, the elastic sheet 202, and the circuit substrate 203 are laminated together.

Similar to the first exemplary embodiment described above, in order to achieve a high attaching property and easiness of removing the attaching member, a self-tacking elastic sheet which can exert an adhesive force without using a bond, such as a gel sheet, is used as the nonconductive elastic sheet 202.

Figure 7A:
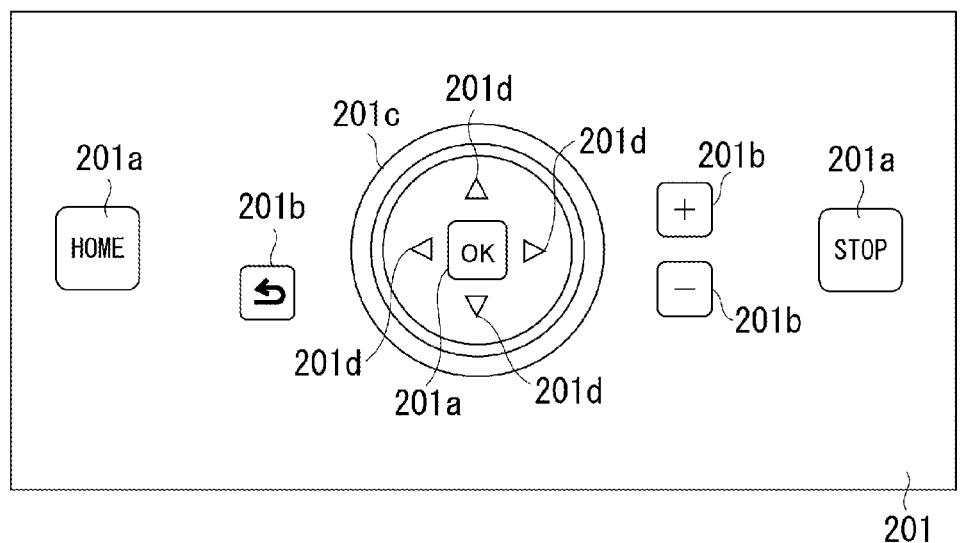
FIGS. 7A and 7B illustrate exemplary components of a touch panel.

FIG. 7A illustrates an example of the panel cover 201 in detail. In the example illustrated in FIG. 7A, the panel cover 201 has a configuration different from that of the first exemplary embodiment.

In the present exemplary embodiment, three large keys 201a, three middle-size keys 201b, a job wheel 201c having a ring-like shape, and four arrow keys 201d are provided as the capacitance touch switches. A graphic (mark) uniquely assigned to each key is printed on the upper surface of the panel cover 201.

For the jog wheel 201c and an OK key 201a, which is provided at the center of the jog wheel 201c, are highly frequently used. Accordingly, a recessed dent is formed on the panel cover 201 as in the first exemplary embodiment. Although not illustrated in FIG. 7A, a power switch, which has a structure of a mechanical switch key as in the first exemplary embodiment, is also provided.

Figure 7B:
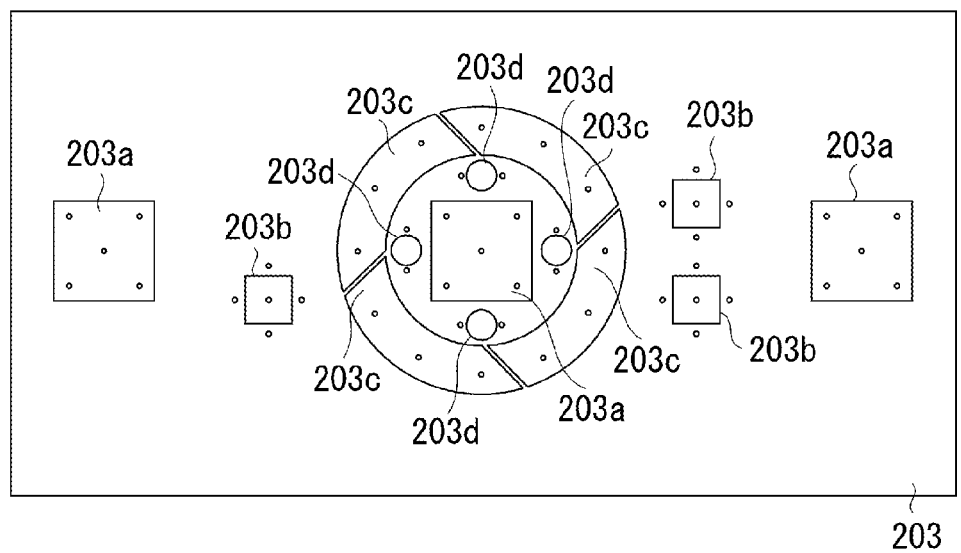

FIG. 7B illustrates an exemplary configuration of the circuit substrate 203. Referring to FIG. 7B, a plurality of electrodes is mounted corresponding to the plurality of keys included in the panel cover 201. More specifically, the circuit substrate 203 includes an electrode 203a, which corresponds to the key 201a, an electrode 203b, which corresponds to the key 201b, an electrode 203c, which corresponds to the jog wheel 201c, and an electrode 203d, which corresponds to the key 201d. The electrode 203c is a ring-shaped electrode divided into four. Each of the other electrodes is provided as a uniform electrode for one corresponding key.

Figure 8A:
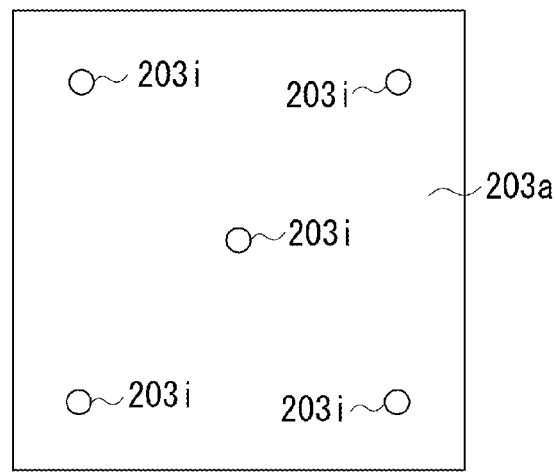
FIGS. 8A through 8C illustrate an exemplary positional relationship between electrodes and through holes formed at a close location thereto.

FIG. 8A is an enlarged view of the electrode 203a and proximity portions thereto on the circuit substrate 203. On the circuit substrate 203, a through hole 203i is formed at five locations in total (i.e., at one location (at the gravity center of the rectangular electrode) and the other four at locations around the gravity center) within the electrode 203a.

The through hole 203i is a hole provided all through the electrode itself and the substrate provided therebelow. The electrode 203a has a large area. Accordingly, in assembling the electrode 203a, air may easily intrude a portion between the electrode 203a and the elastic sheet 202 and an air gap may easily arise there.

Accordingly, in the present exemplary embodiment, the through hole 203i is provided to the electrode at a plurality of locations thereon and inside the surface thereof. Therefore, the intruded air can be effectively lost from the top portion of the electrode during assembly thereof.

Figure 8B:
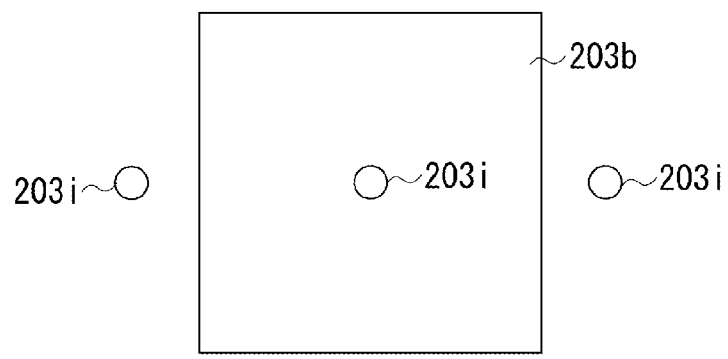

FIG. 8B is an enlarged view of the electrode 203b and surrounding portions thereof. On the circuit substrate 203, a through hole 203i is formed at five locations in total (i.e., at one location (at the gravity center of the rectangular electrode) and the other four at locations external to the electrode 203b and around).

The electrode 203b has a relatively small area compared with the electrode 203a. Accordingly, if a plurality of through holes is formed within the surface of the electrode 203b, the area of the electrode itself may decrease. In this case, the detection sensitivity may not be sufficiently high.

In the present exemplary embodiment, in order to prevent this problem, the through hole is provided within the surface of the electrode at one location thereon only and a plurality of through holes is provided externally to the electrode and around. With this configuration, the intruded air can be effectively lost from the top portion of the electrode during assembly thereof.

Figure 9:
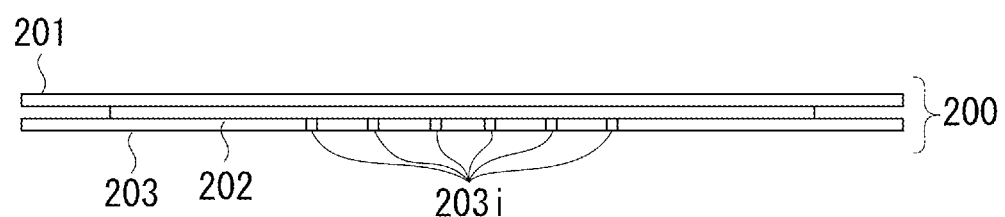
FIG. 9 is a cross section illustrating an exemplary structure of a through hole.

FIG. 9 is a C-C cross section of the panel cover 201, the elastic sheet 202, and the circuit substrate 203 laminated together and illustrated in FIG. 6B. Referring to FIG. 9, six through holes are formed through the circuit substrate 203.

Figure 8C:
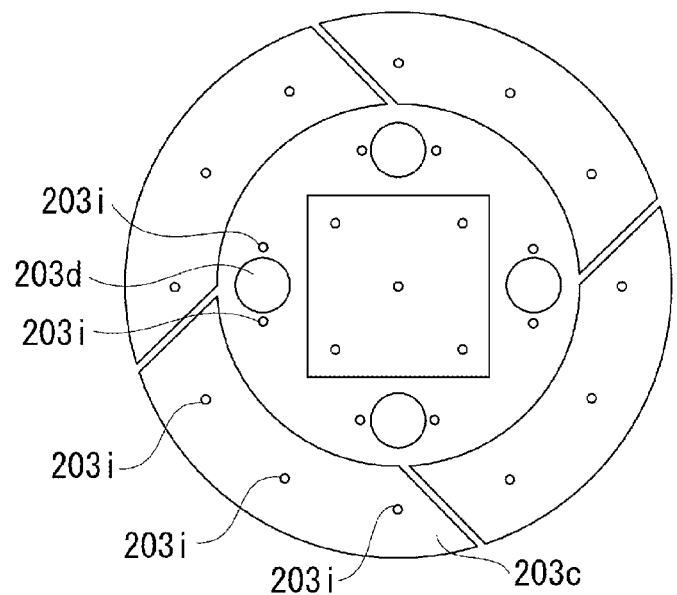

FIG. 8C is an enlarged view of the electrode 203c and surrounding portions. The through hole 203i is formed for each of the ring-shaped electrode 203c divided into four. The area of each electrode is large. Therefore, the present exemplary embodiment forms a plurality of through holes 203i within the surface of the electrode to effectively release the intruded air during assembly.

FIG. 8C is also an enlarged view of the electrode 203d and surrounding portions. Referring to FIG. 8C, through holes 203i are formed for each of the four small electrodes 203d at two locations external to and around the electrode 203d. The area of the electrode 203d is smaller than that of the circuit substrate 203. Accordingly, no through hole can be formed within the surface of the electrode 203d.

Therefore, the present exemplary embodiment provides the through holes at a plurality of locations outside and around the electrode. Accordingly, the intruded air can be effectively released from above the electrode during assembly.

The elastic sheet 202 is a self-tack, easily removable gel sheet, which does not use a bond. Accordingly, after the operation panel is completely assembled, it becomes easy to disassemble the operation panel to execute a maintenance operation or to exchange the switch.

In reassembling the operation panel, the through holes formed at a plurality of locations on the circuit substrate function to easily release the intruded air from above the electrodes. Accordingly, it is easy to reassemble the operation panel.

In addition, the gel sheet 202 is one integrated nonconductive sheet. It is not required to divide the gel sheet 202 for each sheet or to attach the same after highly precisely aligning the gel sheet 202. In other words, the operation device according to the present exemplary embodiment can be implemented with a simple switch configuration and easily assembled at low costs of manufacture.

As described above, in the present exemplary embodiment, the through holes for releasing the intruded air are provided at locations, on the circuit substrate, surrounding the electrode and facing the elastic sheet. In addition, the elastic sheet is one integrated (not divided) sheet that is common to the plurality of electrodes.

With the above-described configuration, the operation device according to the present exemplary embodiment can be easily assembled and manufactured at low costs.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. An operation device having a touch switch, the operation device comprising:
   a cover having a touch portion of the touch switch, wherein on the cover, a transparent graphic portion is formed at a location of the touch switch;
   an electronic substrate on which an electrode to detect capacitance for the touch switch is mounted;
   a light source for a backlight of the touch switch mounted on the electronic substrate together with and corresponding to the electrode; and
   an elastic sheet disposed between the cover and the electronic substrate, the elastic sheet contacting at least the electrode on the electronic substrate, wherein the cover, the electronic substrate, and the elastic sheet are laminated together,
   wherein the electronic substrate has at least one through hole at a location facing the elastic sheet in a vicinity of the electrode.

2. The operation device according to claim 1, further comprising a light guide element disposed between the elastic sheet and the cover, the elastic sheet contacting the light guide element.

3. The operation device according to claim 2, further comprising a second elastic sheet laminated between the cover and the light guide element.

4. The operation device according to claim 3, wherein the second elastic sheet is translucent.

5. The operation device according to claim 3, wherein the second elastic sheet is a gel sheet.

6. The operation device according to claim 1, wherein the elastic sheet is self-tacking.

7. The operation device according to claim 1, wherein the elastic sheet is a gel sheet.

8. The operation device according to claim 1, wherein the elastic sheet is not divided and is common to the electrode.

9. The operation device according to claim 1, wherein the backlight turns on if input is enabled to the touch switch, and turns off if input to the touch switch is disabled.

10. An apparatus to perform at least one of printing and reading of images, the apparatus comprising the operation device according to claim 1.

\* \* \* \* \*